(12) United States Patent
An

(10) Patent No.: US 9,293,730 B2
(45) Date of Patent: Mar. 22, 2016

(54) FLEXIBLE ORGANIC LIGHT EMITTING DIODE DISPLAY AND MANUFACTURING METHOD THEREOF

(71) Applicant: SAMSUNG DISPLAY CO., LTD., Yongin, Gyeonggi-Do (KR)

(72) Inventor: Chi Wook An, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/510,064

(22) Filed: Oct. 8, 2014

(65) Prior Publication Data

US 2015/0102326 A1    Apr. 16, 2015

(30) Foreign Application Priority Data

Oct. 15, 2013  (KR) .................. 10-2013-0122869
Sep. 19, 2014  (KR) .................. 10-2014-0125183

(51) Int. Cl.
| | |
|---|---|
| *H01L 51/52* | (2006.01) |
| *H01L 27/32* | (2006.01) |
| *H01L 51/00* | (2006.01) |
| *H01L 51/56* | (2006.01) |

(52) U.S. Cl.
CPC ........ *H01L 51/5253* (2013.01); *H01L 27/3241* (2013.01); *H01L 51/0097* (2013.01); *H01L 51/5256* (2013.01); *H01L 51/56* (2013.01); *H01L 27/3244* (2013.01); *H01L 2251/5338* (2013.01)

(58) Field of Classification Search
None
See application file for complete search history.

(56) References Cited

U.S. PATENT DOCUMENTS

| 5,757,126 | A | 5/1998 | Harvey, III et al. | |
|---|---|---|---|---|
| 8,247,809 | B2 * | 8/2012 | Kim ............................. | 257/40 |
| 8,350,467 | B2 * | 1/2013 | Oh et al. ..................... | 313/506 |
| 8,895,968 | B2 * | 11/2014 | Jeong ........................... | 257/40 |
| 2007/0159089 | A1 * | 7/2007 | Oh et al. ..................... | 313/506 |
| 2007/0182314 | A1 * | 8/2007 | Oh et al. ..................... | 313/500 |
| 2007/0196682 | A1 | 8/2007 | Visser et al. | |
| 2008/0238303 | A1 * | 10/2008 | Lee et al. .................... | 313/504 |
| 2010/0232162 | A1 * | 9/2010 | Shin et al. ................... | 362/293 |
| 2011/0273824 | A1 * | 11/2011 | Tanase et al. ............ | 361/679.01 |
| 2012/0241771 | A1 * | 9/2012 | Kato et al. .................. | 257/88 |
| 2014/0152174 | A1 * | 6/2014 | Wang et al. ................. | 313/511 |

(Continued)

FOREIGN PATENT DOCUMENTS

| CN | 103022354 A | 4/2013 |
|---|---|---|
| EP | 2 445 028 A1 | 4/2012 |

(Continued)

OTHER PUBLICATIONS

EPO Search Report dated Apr. 14, 2015, for corresponding European Patent application 14188721.6, (8 pages).

*Primary Examiner* — Scott B Geyer
(74) *Attorney, Agent, or Firm* — Lewis Roca Rothgerber Christie LLP

(57) ABSTRACT

A flexible organic light emitting diode (OLED) display according to an exemplary embodiment includes: a substrate; an organic light emitting diode (OLED) layer provided on the substrate; and a thin film encapsulation layer provided on the OLED layer. The thin film encapsulation layer includes a plurality of laminated inorganic layers, at least one inorganic layer of the plurality of inorganic layers includes a plurality of inorganic layer patterns that are disposed to be spaced apart from each other on a plane, and an organic layer is formed between the plurality of inorganic layer patterns.

17 Claims, 18 Drawing Sheets

(56) References Cited

U.S. PATENT DOCUMENTS

2014/0242354 A1* 8/2014 Ro et al. .................... 428/195.1
2015/0084003 A1 3/2015 Kim et al.

FOREIGN PATENT DOCUMENTS

| | | |
|---|---|---|
| JP | 2011-027822 | 2/2011 |
| JP | 4763496 B2 | 8/2011 |
| KR | 10-0707210 B1 | 4/2007 |
| KR | 10-2008-0107834 | 12/2008 |
| KR | 10-2009-0086329 | 8/2009 |
| KR | 10-2011-0067411 | 6/2011 |
| KR | 10-2011-0080050 | 7/2011 |
| KR | 10-1065318 B1 | 9/2011 |
| KR | 10-2014-0042553 | 4/2014 |

* cited by examiner

FLEXIBLE ORGANIC LIGHT EMITTING DIODE DISPLAY AND MANUFACTURING METHOD THEREOF

CROSS-REFERENCE TO RELATED APPLICATION

This application claims priority to and the benefit of Korean Patent Application No. 10-2013-0122869 filed in the Korean Intellectual Property Office on Oct. 15, 2013, and Korean Patent Application No. 10-2014-0125183 filed in the Korean Intellectual Property Office on Sep. 19, 2014, the entire contents of both of which are incorporated herein by reference.

BACKGROUND

1. Field

The described technology relates generally to a flexible organic light emitting diode display and a manufacturing method thereof, and more particularly, to a flexible organic light emitting diode display having a thin film encapsulation layer structure including a plurality of inorganic and organic layers.

2. Description of the Related Art

An organic light emitting diode (OLED) display includes organic light emitting diodes (OLEDs), each of which includes a hole injection electrode, an organic emission layer, and an electron injection electrode.

Each OLED emits light using (utilizing) energy generated when electrons and holes are combined to create exitons in the organic emission layer and the exitons fall from an exited state to a ground state.

When a substrate of an OLED display including OLEDs is formed of a flexible film (such as a polyimide or the like), the OLED display can be easily bendable and is advantageous in forming a slim structure.

When the flexible OLED display is bent, stress occurs, specifically, tensile stress occurs at its convex outer side and compressive stress occurs at its concave inner side, and a neutral plane NP at which no stress occurs is present in an intermediate region therebetween.

A picture abnormality does not occur in the OLED display when (e.g., only when) the OLEDs are positioned at (e.g., in) the neutral plane.

However, when the thickness of the organic light emitting diode display is increased by internal and external films such as a polarizing film and a passivation film attached to the organic light emitting diode display, the tensile stress and the compressive stress are increased such that the neutral plane becomes narrow, thereby making it difficult to position the organic light emitting element at the neutral plane.

Further, the OLED display has a structure in which composite materials are layered and thus asymmetry of strains occurs due to a difference between tensile stress and compressive stress that are applied to outer and inner sides of a bent portion. Accordingly, it is difficult to position the OLED at the neutral plane, thereby causing display defects.

In addition, when the OLED display is bent, a moisture permeation path may be created in a display area through cracks formed due to excessive stress. Also, deformation of organic and inorganic layers forming a thin film encapsulation layer may cause deformation of the display area or other defects.

The above information disclosed in this Background section is only for enhancement of understanding of the background of the described technology and therefore it may contain information that does not form the prior art that is already known in this country to a person of ordinary skill in the art.

SUMMARY

An aspect of an embodiment of the described technology has been made in an effort to provide a flexible organic light emitting diode (OLED) display having advantages of preventing or reducing cracks from being generated at inorganic layers of a thin film encapsulation layer and/or preventing or reducing moisture permeation into the display area from the thin film encapsulation layer when the flexible OLED display is bent or folded.

A flexible organic light emitting diode (OLED) display according to an exemplary embodiment includes: a substrate; an organic light emitting diode (OLED) layer provided on the substrate; and a thin film encapsulation layer provided on the OLED layer. The thin film encapsulation layer includes: a plurality of laminated inorganic layers, at least one inorganic layer of the plurality of inorganic layers including a plurality of inorganic layer patterns that are disposed to be spaced apart from each other on a plane; and an organic layer formed between the plurality of inorganic layer patterns.

In the flexible OLED display according to the exemplary embodiment, the at least one inorganic layer, the plurality of inorganic layer patterns, and the organic layer may be respectively a first inorganic layer, first inorganic layer patterns, and a first organic layer, and a second inorganic layer may be disposed on the first organic layer and may include a plurality of second inorganic layer patterns that are disposed between the first inorganic layer patterns to be spaced apart from each other.

The flexible OLED display may further include: a second organic layer disposed between the plurality of second inorganic layer patterns; and a third inorganic layer disposed on the second organic layer and including a plurality of third inorganic layer patterns that are disposed between the second inorganic layer patterns to be spaced apart from each other.

The first and second inorganic layer patterns may partially contact each other.

The plurality of inorganic layers may be disposed above an organic emission layer of the organic light emitting diode layer.

The plurality of inorganic layer patterns may be coupled to each other through the inorganic layer patterns of the inorganic layers of the respective different layers.

The plurality of inorganic layer patterns may be formed in a matrix form in which a square shape is repeatedly disposed on a plane.

The plurality of inorganic layer patterns may be formed in a matrix form in which a circular shape is repeatedly disposed on a plane.

The plurality of inorganic layer patterns may be formed in a matrix form in which a rectangular shape is repeatedly disposed on a plane.

The plurality of inorganic layer patterns may be arranged in a direction along which the substrate is bendable.

The plurality of inorganic layer patterns may be formed in a matrix form in which a triangular pyramidal shape is repeatedly disposed.

The plurality of inorganic layer patterns may respectively have different sizes in a bending region where the substrate is bent and in an unbending region where the substrate is not bent.

A manufacturing method of a flexible OLED display according to the exemplary embodiment includes: forming an OLED layer including an anode coupled to a transistor, an organic emission layer on the anode, and a cathode on the organic emission layer, on a substrate, and forming a thin film encapsulation layer on the OLED layer. The forming of the thin film encapsulation layer includes: a first deposition act of depositing a first inorganic layer on the OLED layer; a first etching act of patterning the first inorganic layer to include a plurality of first inorganic layer patterns that are disposed to be spaced apart from each other; a second deposition act of depositing a first organic layer between the patterned first inorganic layer patterns using (utilizing) a first mask; a third deposition act of depositing a second inorganic layer on the first organic layer; and a second etching act of patterning the second inorganic layer to include a plurality of second inorganic layer patterns that are disposed to be spaced apart from each other.

The manufacturing method of the flexible OLED display according to the exemplary embodiment may further include, after the second etching act: a fourth deposition act of depositing a second organic layer between the patterned second inorganic layer patterns; a fifth deposition act of depositing a third inorganic layer on the second organic layer; and a third etching act of patterning the third inorganic layer to include a plurality of third inorganic layer patterns that are disposed to be spaced apart from each other.

According to the exemplary embodiments, when the flexible OLED display is bent or folded, the stress of the inorganic layers are alleviated by the inorganic layer patterns of the inorganic layers of the thin film encapsulation layer, thereby preventing the cracks from being generated at the inorganic layer and/or the moisture permeation into the display area from the thin film encapsulation layer.

DETAILED DESCRIPTION

Figure 1:
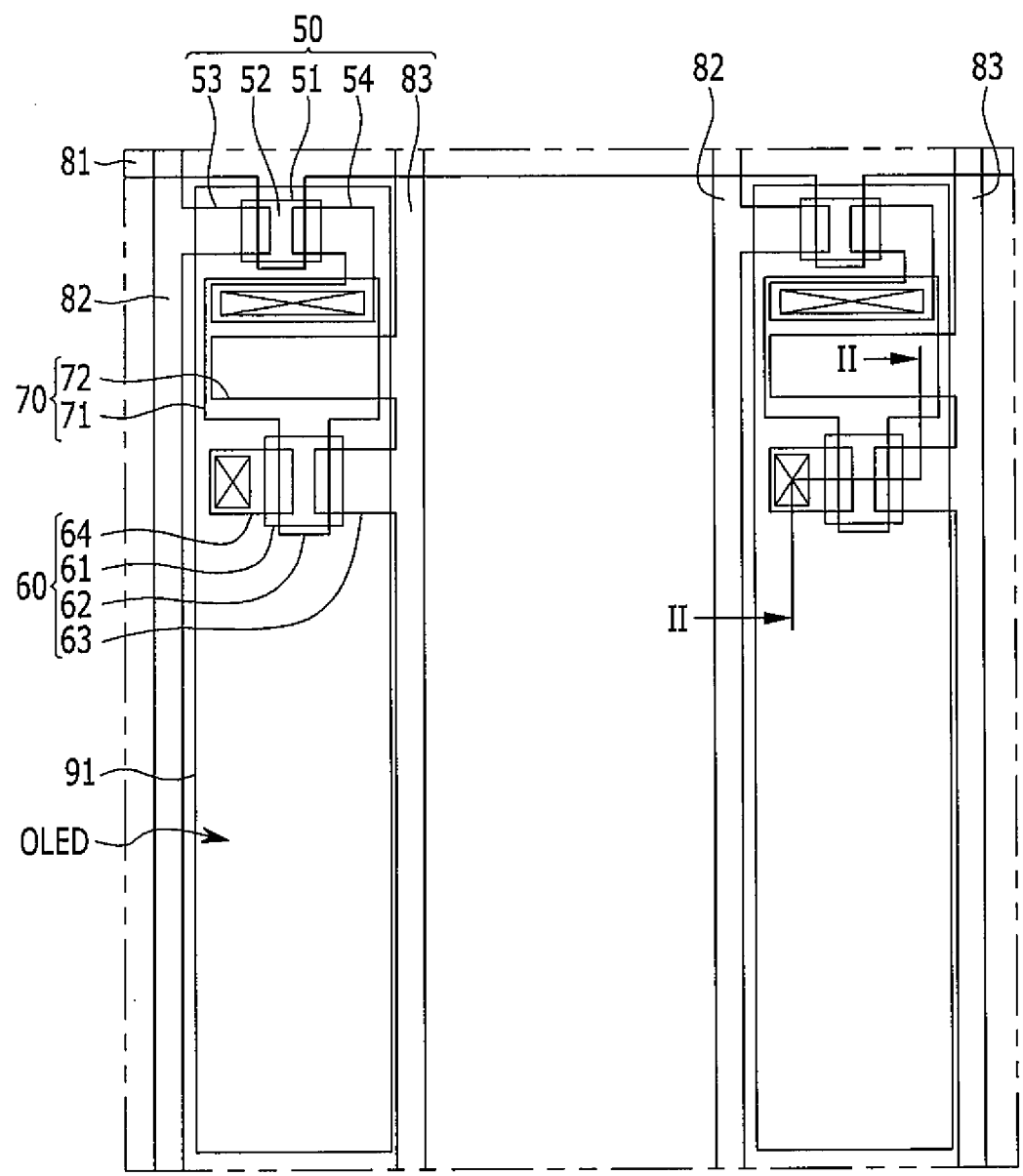
FIG. 1 is a layout view of a pixel structure of a flexible organic light emitting diode (OLED) display according to an exemplary embodiment.

The present invention will be described more fully hereinafter with reference to the accompanying drawings, in which exemplary embodiments of the invention are shown.

As those skilled in the art would realize, the described embodiments may be modified in various different ways, all without departing from the spirit or scope of the present invention.

Further, in exemplary embodiments, since like reference numerals designate like elements having the same configuration, a first exemplary embodiment is representatively described, and in other exemplary embodiments, only different configurations from the first exemplary embodiment will be described.

The drawings are schematic and are not illustrated in accordance with a scale.

The relative sizes and ratios of the parts in the drawings are exaggerated or reduced for clarity and convenience, and the arbitrary sizes are only exemplary and are not limiting.

The same structures, elements, or parts illustrated in no less than two drawings are denoted by the same reference numerals in order to represent similar characteristics.

When a part is referred to as being "on" another part, it can be directly on the other part or one or more intervening parts may also be present. In contrast, when an element or layer is referred to as being "directly on", there are no intervening elements or layers present.

Exemplary embodiments specifically show one exemplary embodiment. As a result, various modifications of the drawings are anticipated.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the inventive concept." Also, the term "exemplary" is intended to refer to an example or illustration.

It will be understood that when an element or layer is referred to as being "connected to", "coupled to", or "adjacent to" another element or layer, it can be directly connected to, coupled to, or adjacent to the other element or layer, or one or more intervening elements or layers may be present. In contrast, when an element or layer is referred to as being "directly connected to", "directly coupled to", or "immediately adjacent to" another element or layer, there are no intervening elements or layers present.

As used herein, the term "substantially," "about," and similar terms are used as terms of approximation and not as terms of degree, and are intended to account for the inherent deviations in measured or calculated values that would be recognized by those of ordinary skill in the art.

Accordingly, the exemplary embodiments are not limited to certain forms of the regions illustrated, but may include forms that are modified through manufacturing, for example.

A flexible organic light emitting diode (OLED) display according to an exemplary embodiment will now be described with reference to FIGS. 1 to 4.

Figure 2:
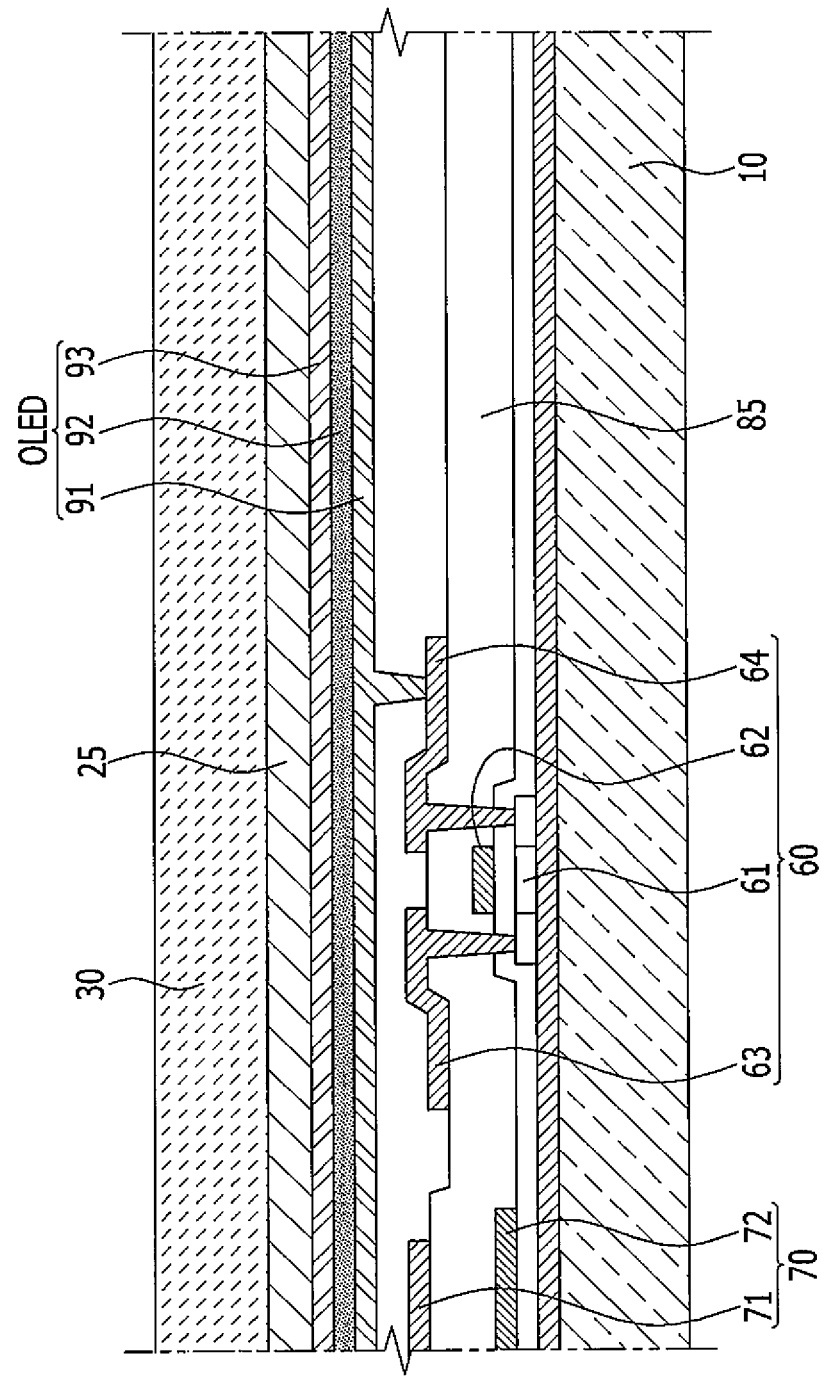
FIG. 2 is a drawing showing a cross-section of the OLED display taken along the line II-II of FIG. 1.

FIG. 1 is a layout view of a pixel structure of a flexible organic light emitting diode (OLED) display according to an exemplary embodiment, and FIG. 2 is a drawing showing a cross-section of the OLED display taken along the line II-II of FIG. 1.

Referring to FIGS. 1 and 2, the OLED display includes a pixel circuit and an organic light emitting diode (OLED) that are formed in each pixel.

In one embodiment, each pixel circuit includes a switching thin film transistor 50, a driving thin film transistor 60, and a capacitor 70.

In addition, the flexible OLED display includes: a gate line 81 that extends along a first direction; and a data line 82 and a driving voltage line 83 that are insulated from the gate line 81 and extend along a second direction crossing the first direction.

In this case, one pixel may be defined by a boundary of the gate line 81, the data line 82, and the driving voltage line 83, but it is not necessarily limited thereto.

Each pixel is a basic unit for displaying an image, and the flexible OLED display displays the image using (utilizing) a plurality of pixels.

In FIGS. 1 and 2, an active matrix flexible display device having a 2Tr-1Cap structure where two thin film transistors 50 and 60 and one capacitor 70 are provided in one pixel is illustrated, but the structure of the flexible OLED display is not limited to the illustrated example.

The flexible OLED display may include three or more thin film transistors and two or more capacitors, and additional wires may be further formed therein to have various suitable structures.

The OLED includes an anode 91, an organic emission layer 92, and a cathode 93.

One of the anode 91 and the cathode 93 is a hole injection electrode, and the other is an electron injection electrode.

Light is emitted when electrons and holes are injected into the organic emission layer 92 from the anode 91 and the cathode 93 and excitons in which holes and electrons are combined fall from an excited state to a ground state.

The anode 91 may be formed of a metal having high reflectance, and the cathode 93 may be formed of a transparent conductive layer.

In this case, light of the organic emission layer 92 is reflected by the anode 91, and passes through the cathode 93 and a thin film encapsulation layer 30 to be emitted outside.

The capacitor 70 includes a pair of capacitor electrodes 71 and 72 that are disposed while interposing an interlayer insulating layer 85 therebetween as a dielectric material.

Capacitance of the capacitor 70 is determined by charges stored in the capacitor 70 and a voltage between the capacitor electrodes 71 and 72.

The switching thin film transistor 50 includes a switching semiconductor layer 51, a switching gate electrode 52, a switching source electrode 53, and a switching drain electrode 54.

The driving thin film transistor 60 includes a driving semiconductor layer 61, a driving gate electrode 62, a driving source electrode 63, and a driving drain electrode 64.

The switching thin film transistor 50 is used (utilized) as a switching element for selecting pixels that are desired to emit light.

The gate electrode 52 is coupled to the gate line 81.

The switching source electrode 53 is coupled to the data line 82, and the switching drain electrode 54 is coupled to one capacitor electrode (i.e., the capacitor electrode 71).

The driving thin film transistor 60 applies a driving power for allowing the organic emission layer 92 of the selected pixel to emit light to the anode 91.

The driving gate electrode 62 is coupled to the capacitor electrode 71 that is coupled to the switching drain electrode 54.

The driving source electrode 63 and the other capacitor electrode 72 are coupled to the driving voltage line 83.

The driving drain electrode 64 is coupled to the anode 91 of the OLED through a contact opening (e.g., hole).

The switching thin film transistor 50 is operated by a gate voltage that is applied to the gate line 81, and transmits a data voltage applied to the data line 82 to the driving thin film transistor 60.

A voltage corresponding to a difference between a common voltage applied to the driving thin film transistor 60 from the driving voltage line 83 and the data voltage provided from the switching thin film transistor 50 is stored in the capacitor 70, and a current corresponding to the voltage stored in the capacitor 70 flows into the OLED through the driving thin film transistor 60, thereby allowing the organic emission layer 92 to emit light.

Figure 3:
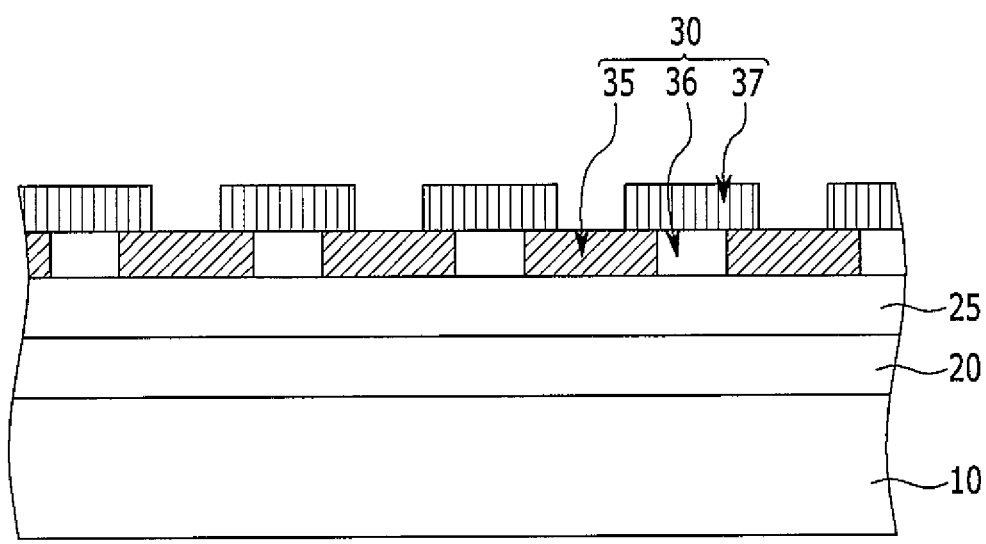
FIG. 3 is a schematic cross-sectional view of the OLED display according to the exemplary embodiment.

FIG. 3 is a schematic cross-sectional view of the OLED display according to the exemplary embodiment.

Referring to FIG. 3, the flexible OLED display may include the thin film encapsulation layer 30 above an organic light emitting diode (OLED) layer 20.

The thin film encapsulation layer 30 includes a plurality of laminated inorganic layers 35 and 37, at least one of the plurality of inorganic layers 35 and 37 includes a plurality of inorganic layer patterns that are disposed to be spaced apart from each other on a plane, and an organic layer 36 may be formed between the plurality of inorganic layer patterns.

The thin film encapsulation layer 30 covering the OLED layer 20 prevents (or blocks) external oxygen and moisture from flowing into the OLED to protect it.

Each inorganic layer may be a single layer or laminated layers (stacked in a thickness direction) including a metal oxide or a metal nitride.

For example, the inorganic layer may be formed of a ceramic material such as a SiNx, a SiOx, a SiOxNy, etc., and/or may be formed of a transparent material such as Al2O3, TiO2, MgO, CrO, etc.

In addition, the organic layer may be formed of a polymer, and may be, for example, a single layer or laminated layers formed of any one of polyethylene terephthalate, polyimide, polycarbonate, epoxy, polyethylene, and polyacrylate.

Also, a functional layer 25 may be further provided between the OLED layer 20 and the thin film encapsulation layer 30, and the functional layer 25 may be further included as a capping layer for protecting the OLED layer 20 or controlling light efficiency, and/or as a lithium fluoride (LiF) layer for preventing plasma damage by ions and/or controlling light efficiency.

A halogenated metal layer including lithium fluoride may prevent or protect the organic emission layer from being damaged when the inorganic layers 35 and 37 are formed using (utilizing) a sputtering method and/or a plasma deposition method.

Figure 6:
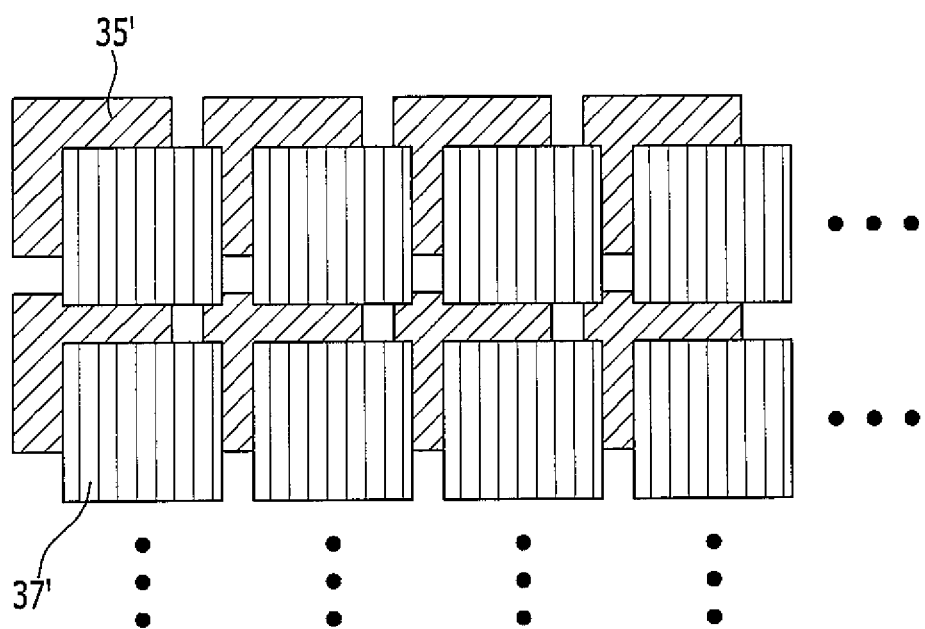
FIG. 6 is a schematic top plan view of a thin film encapsulation layer of FIG. 3.

Specifically and referring also to FIG. 6, the thin film encapsulation layer 30 includes a first inorganic layer 35 provided above the OLED layer 20 and including a plurality of first inorganic layer patterns 35' that are disposed to be spaced apart from each other, a first organic layer 36 disposed between the plurality of first inorganic layer patterns 35', and a second inorganic layer 37 disposed on the first organic layer 36 and including a plurality of second inorganic layer patterns 37' that are disposed to be spaced apart from each other.

That is, the thin film encapsulation layer 30 may consist of two inorganic layers 35 and 37 and one organic layer 36.

The organic layer 36 may be formed by filling an organic material such as an epoxy, an acryl, a PI-based material, etc. between the first inorganic layer patterns 35'.

In addition, the first and second inorganic layer patterns 35' and 37' may be disposed above the organic emission layer of the OLED layer, that is, in a display area.

FIG. 6 is a schematic top plan view of the thin film encapsulation layer of FIG. 3.

Referring to FIGS. 3 and 6, the first and second inorganic layer patterns 35' and 37' may partially contact each other in vertical and horizontal directions.

That is, edge portions of the first and second inorganic layer patterns 35' and 37' contact each other in the vertical direction (thickness direction) and partially overlap each other in the horizontal direction.

Accordingly, the first and second inorganic layer patterns 35' and 37' are configured such that they are coupled to each other through the inorganic layer patterns of the inorganic layers of the respective different layers.

In FIGS. 3 and 6, the inorganic layer consisting of two layers is exemplarily illustrated, but an inorganic layer consisting of three or more layers may be possible.

In addition, the first and second inorganic layer patterns 35' and 37' may be formed as a matrix form in which an overall square shape (e.g., a square hexahedrical) is repeatedly disposed on a plane.

Also, the flexible substrate 10 may include a flexible plastic material, but is not limited thereto. The flexible substrate 10 may include a metallic substrate formed of stainless steel or the like, or various flexible materials may be used (utilized).

The flexible substrate 10 may include a plastic material with excellent thermal resistance and durability such as polyethylene ether phthalate, polyethylene naphthalate, polycarbonate, polyarylate, polyetherimide, polyether sulfone, polyimide, etc.

Figure 4:
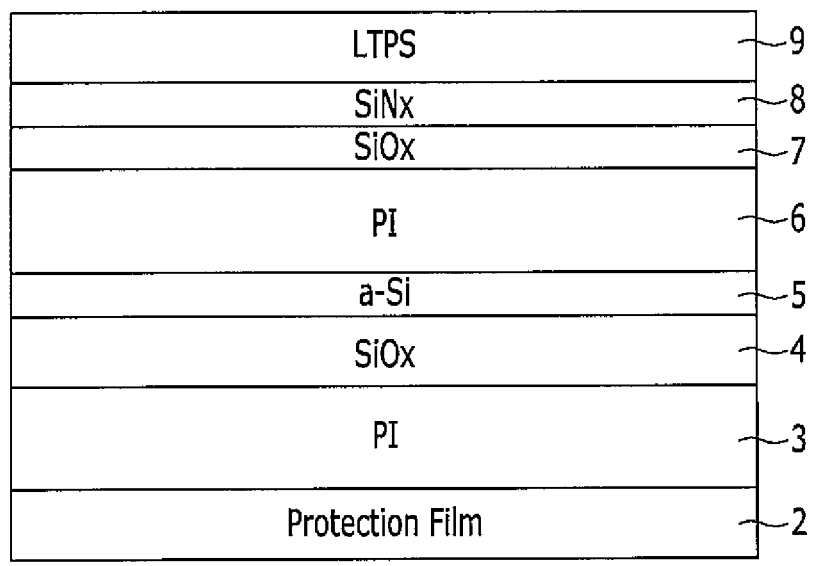
FIG. 4 is a schematic cross-sectional view of one example of a substrate according to an exemplary embodiment of the present invention.

FIG. 4 is a schematic cross-sectional view of one example of the substrate according to the present invention.

Referring to FIG. 4, the substrate 10 according to an embodiment of the present invention includes, below a low temperature polysilicon (LIPS) layer 9, inorganic barrier layers 7 and 8, organic layers (e.g., polyimide layers) 3 and 6, and an amorphous silicon layer 5.

Specifically, the OLED layer 20 may be formed on the LTPS layer 9, and the inorganic layers such as SiNx and SiOx may be formed as the barrier layers 7 and 8.

Below the barrier layers 7 and 8, the organic layer 6 such as polyimide, the amorphous silicon layer 5, a SiOx layer 4, and the polyimide layer 3 may be sequentially downwardly laminated (i.e., downwardly stacked in a thickness direction).

In addition, a lower protection film 2 may be attached to a bottom of the polyimide layer 3.

Figure 5:
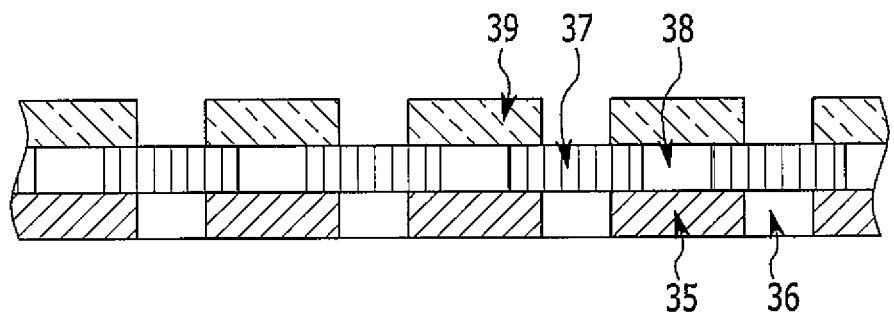
FIG. 5 is a schematic cross-sectional view of a thin film encapsulation layer according to a further exemplary embodiment.
Figure 7:
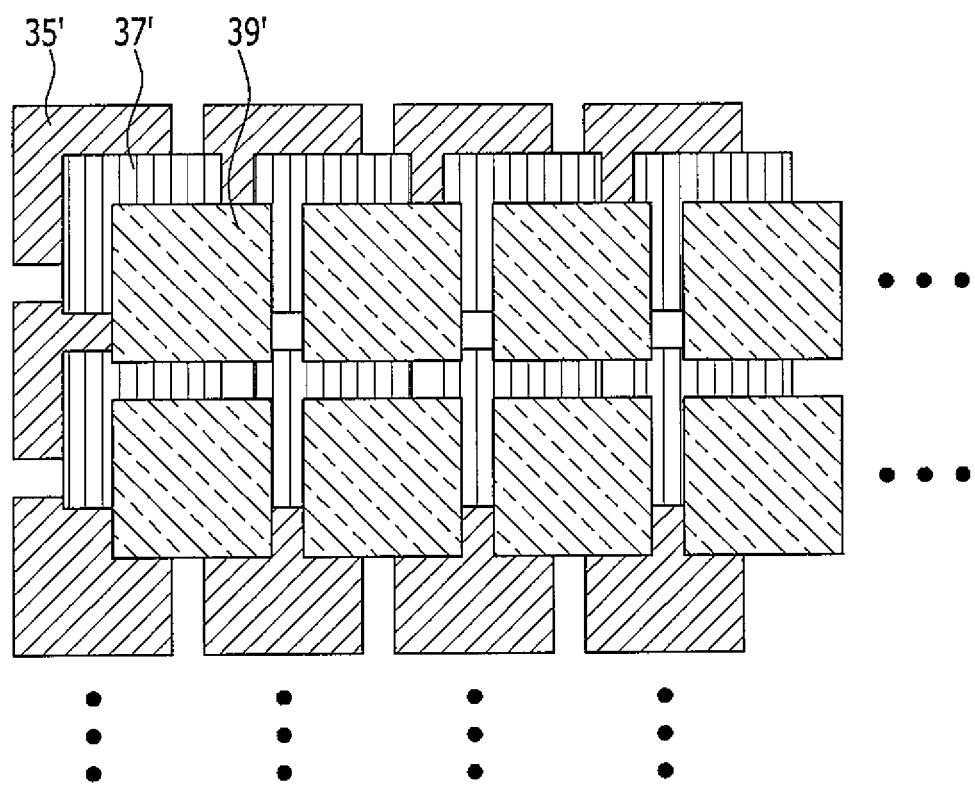
FIG. 7 is a schematic top plan view of the thin film encapsulation layer of FIG. 5.

FIG. 5 is a schematic cross-sectional view of a thin film encapsulation layer according to a further exemplary embodiment, and FIG. 7 is a schematic top plan view of the thin film encapsulation layer of FIG. 5.

Referring to FIGS. 5 and 7, a second organic layer 38 and a third inorganic layer 39 may be further included in the thin film encapsulation layer structure of FIG. 3.

The second organic layer 38 is disposed between the plurality of second inorganic layer patterns 37', and the third inorganic layer 39 may include a plurality of third inorganic layer patterns 39' that are disposed on the second organic layer 38 and between the second inorganic layer patterns 37' to be spaced apart from each other.

Like the exemplary embodiment of FIG. 3, the second and third inorganic layer patterns 37' and 39' may partially contact each other in vertical and horizontal structures.

In addition, the second and third inorganic layer patterns 37' and 39' may be formed in a matrix form in which overall square shapes are repeatedly disposed on a plane.

Figure 8:
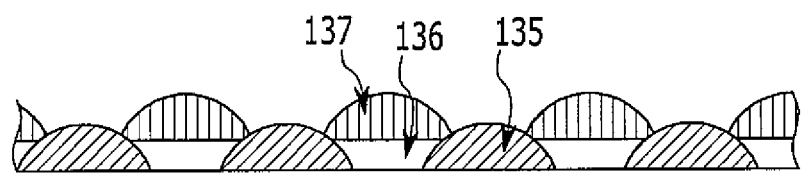
FIG. 8 is a schematic cross-sectional view of a thin film encapsulation layer according to a further exemplary embodiment.
Figure 10:
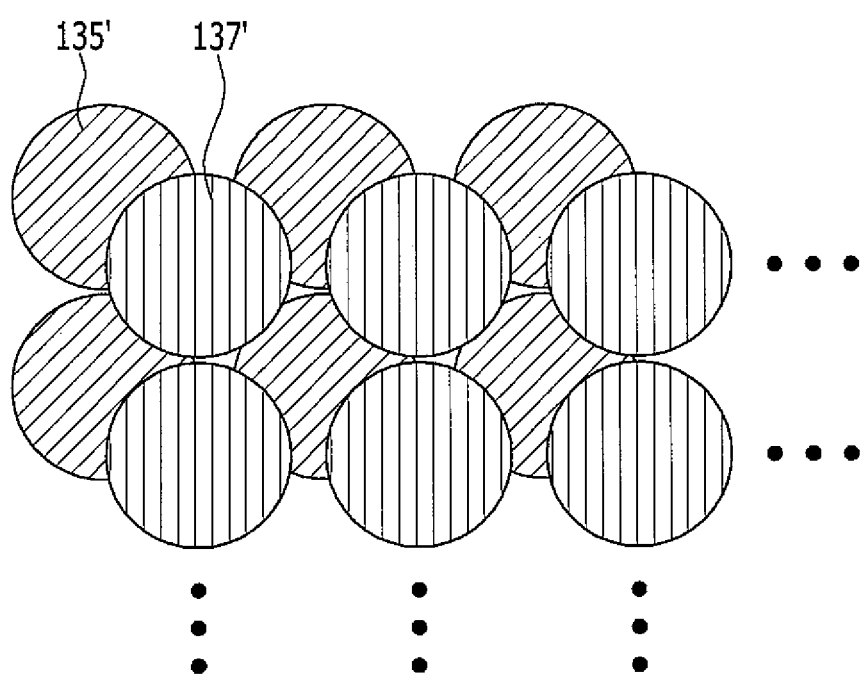
FIG. 10 is a schematic top plan view of the thin film encapsulation layer of FIG. 8.

FIG. 8 is a schematic cross-sectional view of a thin film encapsulation layer according to a further exemplary embodiment, and FIG. 10 is a schematic top plan view of the thin film encapsulation layer of FIG. 8.

Referring to FIGS. 8 and 10, first inorganic layer patterns 135' and second inorganic layer patterns 137' may be formed in a matrix form in which a circular shape (e.g., a circular semispherical shape) is repeatedly disposed on a plane.

In addition, the first and second inorganic layer patterns 135' and 137' may have a substantially semicircular shape in a vertical direction (thickness direction).

Similarly, the first and second inorganic layer patterns 135' and 137' may partially contact each other and may be formed in a matrix form in which they are repeatedly disposed on a plane.

Figure 9:
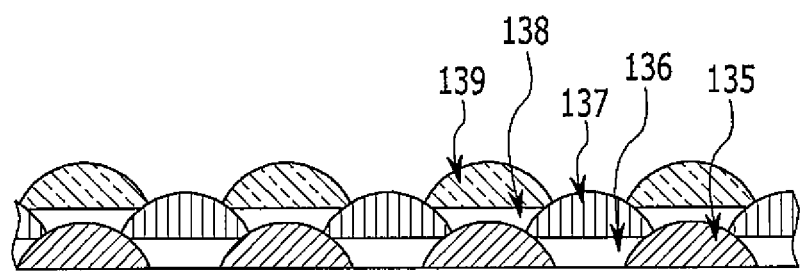
FIG. 9 is a schematic cross-sectional view of a thin film encapsulation layer according to a further exemplary embodiment.
Figure 11:
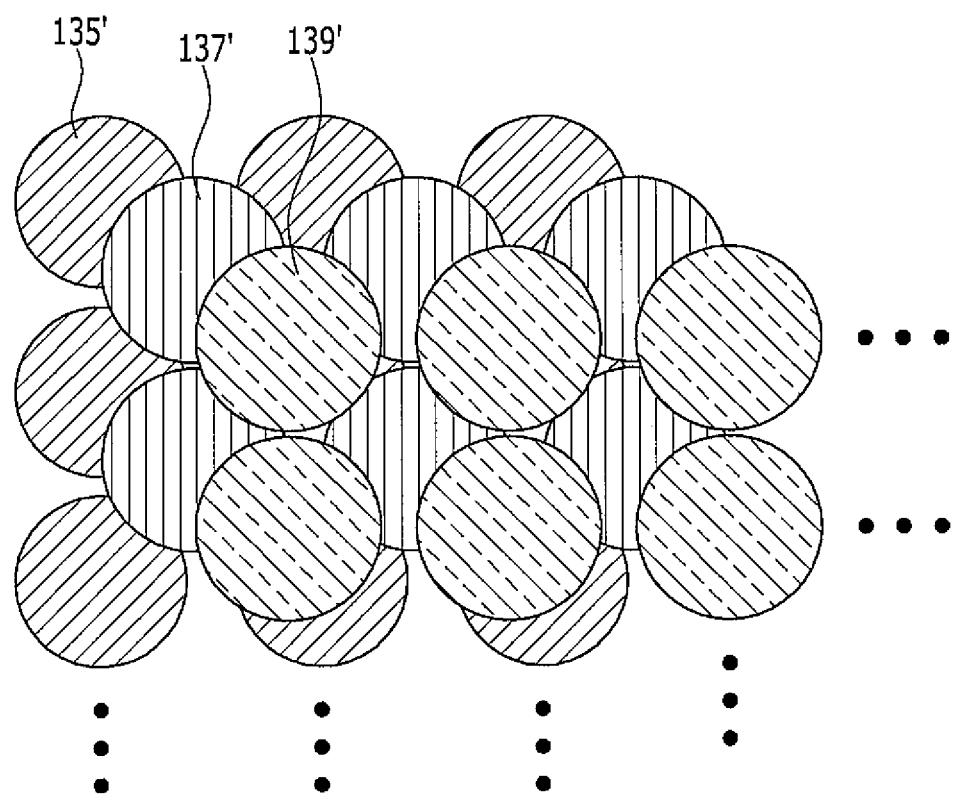
FIG. 11 is a schematic top plan view of the thin film encapsulation layer of FIG. 9.

FIGS. 9 and 11 are drawings schematically showing the thin film encapsulation layer structure in which a third inorganic layer with third inorganic layer patterns 139' are further included in the structure of FIGS. 8 and 10.

Referring to FIGS. 9 and 11, a second organic layer 138 and a third inorganic layer 139 may be further included in the thin film encapsulation layer structure of FIG. 8.

The second organic layer 138 is disposed between the plurality of second inorganic layer patterns 137', and the third inorganic layer 139 may include the plurality of third inorganic layer patterns 139' that are disposed on the second organic layer 138 and between the second inorganic layer patterns 137' to be spaced apart from each other.

Like the aforementioned exemplary embodiment, the second and third inorganic layer patterns 137' and 139' may partially contact each other, and may be formed in a matrix form in which they are repeatedly disposed on a plane.

Figure 12:
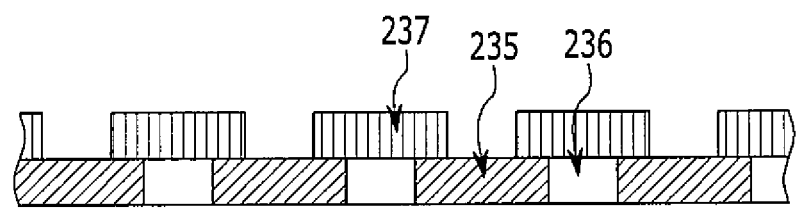
FIG. 12 is a schematic cross-sectional view of a thin film encapsulation layer according to a further exemplary embodiment.
Figure 13:
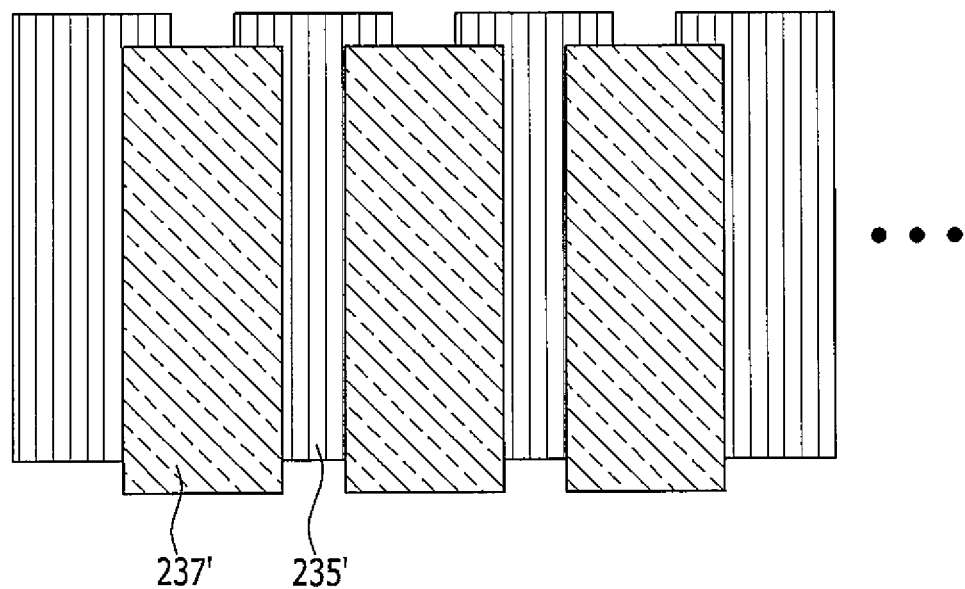
FIG. 13 is a schematic top plan view of the thin film encapsulation layer of FIG. 12.

FIG. 12 is a schematic cross-sectional view of a thin film encapsulation layer according to a further exemplary embodiment, and FIG. 13 is a schematic top plan view of the thin film encapsulation layer of FIG. 12.

Referring to FIGS. 12 and 13, the thin film encapsulation layer may include: a first inorganic layer 235 including a plurality of first inorganic layer patterns 235' that are disposed to be spaced apart from each other; a first organic layer 236 disposed between a plurality of first inorganic layer patterns 235'; and a second inorganic layer 237 disposed on the first organic layer 236 and including a plurality of second inorganic layer patterns 237' that are disposed between the first inorganic layer patterns 235' to be spaced apart from each other.

The first and second inorganic layer patterns 235' and 237' may be formed in a matrix form in which a rectangular shape (e.g., a rectangular hexahedrical) is repeatedly disposed on a plane.

In addition, the plurality of first and second inorganic layer patterns 235' and 237' may be arranged in a direction along which the substrate 10 is bendable.

Since the inorganic layer patterns 235' and 237' are repeatedly disposed on the plane in a horizontal direction, cracks of the inorganic layers of the thin film encapsulation layer can be prevented or reduced when the flexible OLED display is bent or folded in the horizontal direction.

Like the aforementioned exemplary embodiments, the first and second inorganic layer patterns 235' and 237' may partially contact each other in vertical and horizontal directions.

Though not illustrated, a second organic layer and a third inorganic layer may be further included in the thin film encapsulation layer structure of FIG. 12.

The second organic layer is disposed between a plurality of second inorganic layer patterns, and the third inorganic layer may include a plurality of third inorganic layer patterns that are disposed on the second organic layer and between the second inorganic layer patterns to be spaced apart from each other.

Figure 14:
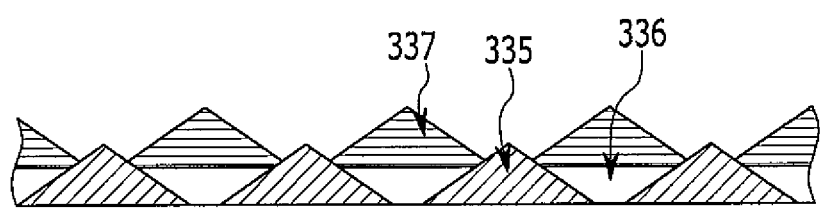
FIG. 14 is a schematic cross-sectional view of a thin film encapsulation layer according to a further exemplary embodiment.
Figure 15:
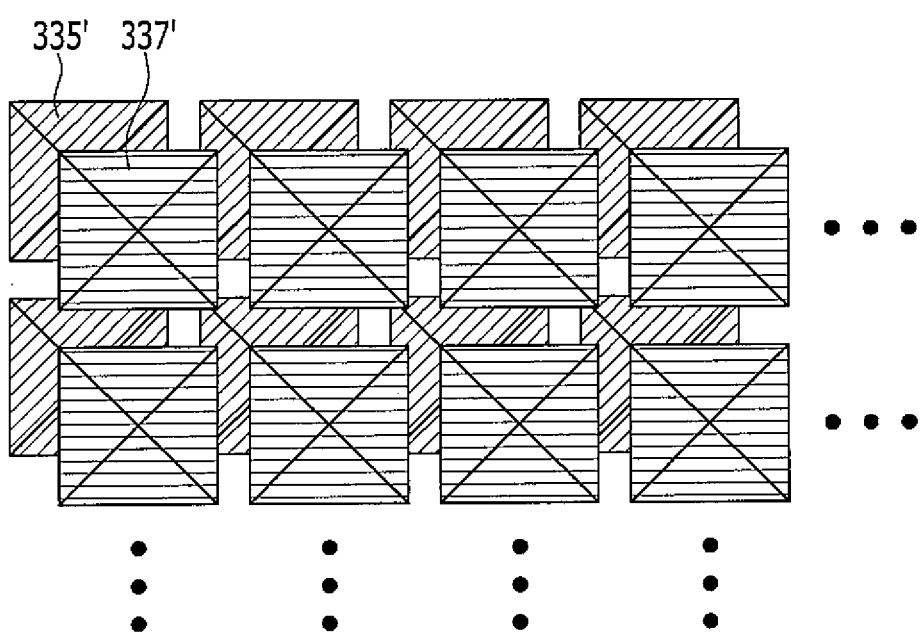
FIG. 15 is a schematic top plan view of the thin film encapsulation layer of FIG. 14.

FIG. 14 is a schematic cross-sectional view of a thin film encapsulation layer according to a further exemplary embodiment, and FIG. 15 is a schematic top plan view of the thin film encapsulation layer of FIG. 14.

Referring to FIGS. 14 and 15, the thin film encapsulation layer structure is similar to those of the aforementioned exemplary embodiments, but is different in that shapes of first and second inorganic layer patterns 335' and 337' may have a triangular pyramidal shape. Since the first and second inorganic layer patterns 335' and 337' may partially contact each other in vertical and horizontal structures, they may have an isosceles triangular shape in the vertical direction and may be formed as a matrix form on a plane in which an overall square shape is repeatedly disposed in the horizontal direction.

Figure 16:
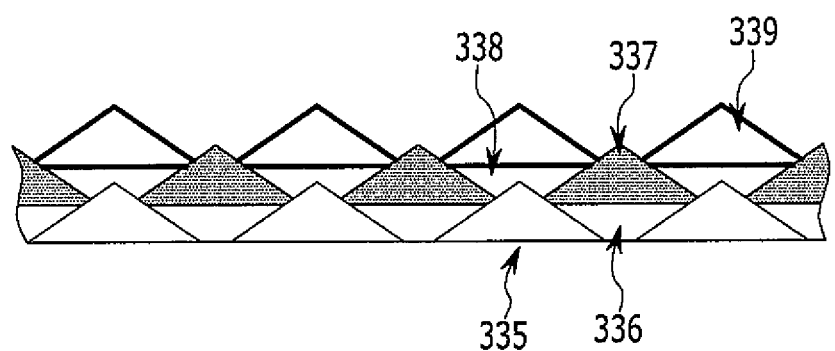
FIG. 16 is a schematic cross-sectional view of a thin film encapsulation layer according to a further exemplary embodiment.
Figure 17:
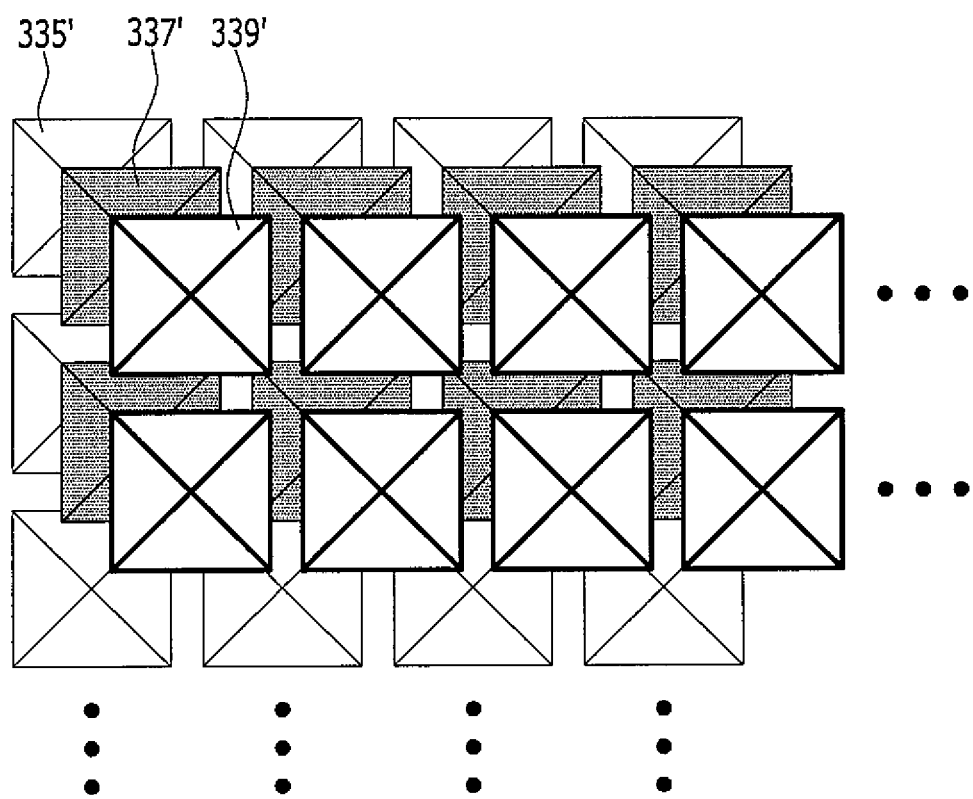
FIG. 17 is a schematic top plan view of the thin film encapsulation layer of FIG. 16.

Referring to FIGS. 16 and 17, the thin film encapsulation layer may further include a second organic layer 338 and a third inorganic layer 339 in the thin film encapsulation layer structure of FIG. 14.

The second organic layer 338 is disposed between the plurality of second inorganic layer patterns 337', and the third inorganic layer 339 includes a plurality of third inorganic layer patterns 339' that are disposed on the second organic layer 338 and between the second inorganic layer patterns 337' to be spaced apart from each other.

Like the aforementioned exemplary embodiments, the second and third inorganic layer patterns 337' and 339' may partially contact each other, and may be formed as a matrix form in which they are repeatedly disposed on a plane.

Shapes of the inorganic layer patterns are not limited to square, rectangular, circular, and triangular pyramidal shapes according to the exemplary embodiments, and may be formed to have various other shapes.

Figure 18:
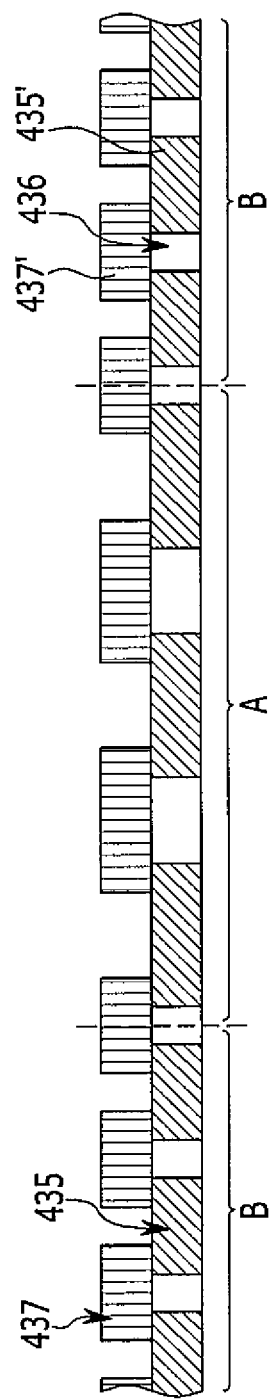
FIG. 18 is a schematic cross-sectional view of a thin film encapsulation layer according to a further exemplary embodiment.

FIG. 18 is a schematic cross-sectional view of a thin film encapsulation layer according to a further exemplary embodiment.

Referring to FIG. 18, the flexible substrate 10 may be differentiated into a bending region B that is bendable and an unbending region A that is not bendable.

The thin film encapsulation layer includes a first inorganic layer 435 provided above the OLED layer and including a plurality of first inorganic layer patterns 435' that are disposed to be spaced apart from each other, a first organic layer 436 disposed between the plurality of first inorganic layer patterns 435', and a second inorganic layer 437 disposed on the first organic layer 436 and including a plurality of second inorganic layer patterns 437' that are disposed between the first inorganic layer patterns 435' to be spaced apart from each other.

However, in the present exemplary embodiment, sizes of the first and second inorganic layer patterns 435' and 437' may be reduced in a bending region B, and the sizes of the first and second inorganic layer patterns 435' and 437' may be increased in an unbending region A. That in, the first and second inorganic layer patterns 435' and 437' in the bending region B may be smaller in size than that of the first and second inorganic layer patterns 435' and 437' in the unbending region A.

In regions where much stress is generated due to a large bending angle of the substrate 10, the sizes of the inorganic layer patterns 435' and 437' are reduced such that a large number of the inorganic layer patterns 435' and 437' are formed in a unit area, thereby further reducing propagation of shocks and cracks caused by the generated stress.

In this case, the bending region B may be a non-active area, and the unbending region A may be an active area.

In addition, the bending region and the unbending region are not strictly differentiated, and the sizes of the inorganic layer patterns 435' and 437' and the number thereof per unit area can be controlled as necessary.

Also, a manufacturing method of a flexible OLED display according to an exemplary embodiment includes, on a substrate, forming an OLED layer including an anode coupled to a transistor, an organic emission layer formed on the anode, and a cathode formed on the organic emission layer, and forming a thin film encapsulation layer on the organic light emitting diode layer.

The forming of the thin film encapsulation layer may include: a first deposition act of depositing a first inorganic layer on the OLED layer; a first etching act of patterning the first inorganic layer to include a plurality of first inorganic layer patterns that are disposed to be spaced apart from each other; a second deposition act of depositing a first organic layer between the patterned first inorganic layer patterns utilizing a first mask; a third deposition act of depositing a second inorganic layer on the first organic layer; and a second etching act of patterning the second inorganic layer to include a plurality of second inorganic layer patterns that are disposed to be spaced apart from each other.

In addition, after the second etching act, the manufacturing method may further include: a fourth deposition act of depositing a second organic layer between the patterned second inorganic layer patterns utilizing a second mask; a fifth deposition act of depositing a third inorganic layer on the second organic layer; and a third etching act of patterning the third inorganic layer to include a plurality of third inorganic layer patterns that are disposed to be spaced apart from each other.

Also, after the forming of the OLED layer, the manufacturing method may further include forming a capping layer for protecting the cathode or controlling light efficiency on the cathode.

The manufacturing method may further include forming a lithium fluoride (LiF) layer for preventing plasma damage by ions and/or controlling light efficiency on the cathode.

As described above, according to the flexible OLED display according to the exemplary embodiments, when the flexible OLED display is bent or folded, the stress of the inorganic layers is alleviated by the inorganic layer patterns of the inorganic layers of the thin film encapsulation layer, thereby preventing or reducing the cracks generated at the inorganic layer and/or the moisture permeation into the display area from the thin film encapsulation layer.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

| Description of Symbols | |
|---|---|
| 100: flexible organic light emitting diode display | 10: substrate |
| 20: organic light emitting diode layer | 30: thin film encapsulation layer |
| 35: first inorganic layer | 36: first organic layer |
| 37: second inorganic layer | 38: second organic layer |
| 39: third inorganic layer | 35': first inorganic layer pattern |
| 37': second inorganic layer pattern | 39': third inorganic layer pattern |

What is claimed is:

1. A flexible organic light emitting diode (OLED) display comprising:
    a substrate;
    an organic light emitting diode (OLED) layer on the substrate; and
    a thin film encapsulation layer on the OLED layer, the thin film encapsulation layer comprising:
        a plurality of laminated inorganic layers, at least one inorganic layer of the plurality of inorganic layers comprising a plurality of inorganic layer patterns spaced apart from each other on a plane, and
        an organic layer between the plurality of inorganic layer patterns.

2. The flexible OLED display of claim 1, wherein the at least one inorganic layer, the plurality of inorganic layer patterns, and the organic layer are respectively a first inorganic layer, first inorganic layer patterns, and a first organic layer, and wherein a second inorganic layer is further included on the first organic layer and comprises a plurality of second inorganic layer patterns disposed between the first inorganic layer patterns to be spaced apart from each other.

3. The flexible OLED display of claim 2, further comprising:
    a second organic layer between the plurality of second inorganic layer patterns; and
    a third inorganic layer on the second organic layer and comprising a plurality of third inorganic layer patterns disposed between the second inorganic layer patterns to be spaced apart from each other.

4. The flexible OLED display of claim 2, wherein the first and second inorganic layer patterns partially contact each other.

5. The flexible OLED display of claim 1, wherein the plurality of inorganic layers are above an organic emission layer of the organic light emitting diode layer.

6. The flexible OLED display of claim 1, wherein the plurality of inorganic layer patterns are coupled to each other through the inorganic layer patterns of the inorganic layers of the respective different layers.

7. The flexible OLED display of claim 1, wherein the plurality of inorganic layer patterns are formed in a matrix form in which a square shape is repeatedly disposed on a plane.

8. The flexible OLED display of claim 1, wherein the plurality of inorganic layer patterns are formed in a matrix form in which a circular shape is repeatedly disposed on a plane.

9. The flexible OLED display of claim 1, wherein the plurality of inorganic layer patterns are formed in a matrix form in which a rectangular shape is repeatedly disposed on a plane.

10. The flexible OLED display of claim 9, wherein the plurality of inorganic layer patterns are arranged in a direction along which the substrate is bendable.

11. The flexible OLED display of claim 1, wherein the plurality of inorganic layer patterns are formed in a matrix form in which a triangular pyramidal shape is repeatedly disposed.

12. The flexible OLED display of claim 1, wherein the plurality of inorganic layer patterns respectively have different sizes in a bending region where the substrate is bent and in an unbending region where the substrate is not bent.

13. The flexible OLED display of claim 12, wherein the inorganic layer patterns in the bending region are smaller in size than that of the inorganic layer patterns in the unbending region.

14. A manufacturing method of a flexible OLED display, the method comprising:
    forming an OLED layer comprising an anode coupled to a transistor, an organic emission layer on the anode, and a cathode on the organic emission layer, on a substrate; and
    forming a thin film encapsulation layer on the OLED layer, the forming of the thin film encapsulation layer comprising:

a first deposition act of depositing a first inorganic layer on the OLED layer;

a first etching act of patterning the first inorganic layer to include a plurality of first inorganic layer patterns spaced apart from each other;

a second deposition act of depositing a first organic layer between the patterned first inorganic layer patterns utilizing a first mask;

a third deposition act of depositing a second inorganic layer on the first organic layer; and a second etching act of patterning the second inorganic layer to include a plurality of second inorganic layer patterns spaced apart from each other.

15. The manufacturing method of claim 14, after the second etching act, the method further comprising:

a fourth deposition act of depositing a second organic layer between the patterned second inorganic layer patterns;

a fifth deposition act of depositing a third inorganic layer on the second organic layer; and a third etching act of patterning the third inorganic layer to include a plurality of third inorganic layer patterns spaced apart from each other.

16. A manufacturing method of a flexible OLED display, the method comprising:

forming an OLED layer comprising an anode coupled to a transistor, an organic emission layer on the anode, and a cathode on the organic emission layer, on a substrate; and forming a thin film encapsulation layer on the OLED layer, the forming of the thin film encapsulation layer comprising:

depositing a first inorganic layer on the OLED layer;

patterning the first inorganic layer to include a plurality of first inorganic layer patterns spaced apart from each other;

depositing a first organic layer between the patterned first inorganic layer patterns utilizing a first mask;

depositing a second inorganic layer on the first organic layer; and patterning the second inorganic layer to include a plurality of second inorganic layer patterns spaced apart from each other.

17. The manufacturing method of claim 16, after the patterning of the second inorganic layer, the method further comprising:

depositing a second organic layer between the patterned second inorganic layer patterns;

depositing a third inorganic layer on the second organic layer; and patterning the third inorganic layer to include a plurality of third inorganic layer patterns spaced apart from each other.

* * * * *